(12) United States Patent
Sorel et al.

(10) Patent No.: US 6,700,650 B2
(45) Date of Patent: Mar. 2, 2004

(54) HOLDER FOR HOLDING A PRINTED CIRCUIT FOR EXPOSURE TO LIGHT

(75) Inventors: Alain Sorel, Les Baux St Croix (FR); Christophe Cousin, Orvaux (FR)

(73) Assignee: Automa Tech, Val de Reuil (FR)

( * ) Notice: Subject to any disclaimer, the term of this patent is extended or adjusted under 35 U.S.C. 154(b) by 9 days.

(21) Appl. No.: 10/109,380

(22) Filed: Mar. 28, 2002

(65) Prior Publication Data

US 2002/0171188 A1 Nov. 21, 2002

(30) Foreign Application Priority Data

Mar. 28, 2001 (FR) .............................. 01 04185

(51) Int. Cl.[7] ..................... G03B 27/20; G03B 27/58; G03B 27/64
(52) U.S. Cl. .............................. 355/91; 355/72; 355/76
(58) Field of Search .............................. 355/72–76, 91, 355/93, 26; 310/10, 12

(56) References Cited

U.S. PATENT DOCUMENTS

| | | |
|---|---|---|
| 2,281,980 A | 5/1942 | Sangu |
| 4,448,522 A | 5/1984 | Raush |
| 4,676,633 A * | 6/1987 | Burgess et al. ............... 355/91 |
| 4,698,284 A | 10/1987 | Cronin |
| 5,272,502 A * | 12/1993 | Saiki .......................... 355/76 |

FOREIGN PATENT DOCUMENTS

EP 0457949 A * 11/1991

* cited by examiner

Primary Examiner—Henry Hung Nguyen
(74) Attorney, Agent, or Firm—James Ray & Associates

(57) ABSTRACT

A holder for exposing both faces of a panel to light in order to make a double-sided printed circuit using first and second flexible artworks. The holder has a first frame with no transparent plane support member for receiving the first flexible artwork, and a second frame with no transparent plane support member for receiving the second flexible artwork. The holder includes a system for positioning and fixing the peripheries of the artworks to their respective frames. The holder further includes a mechanism for positioning and holding the panel between the frames. There is an approach mechanism for causing the frames to move towards the faces of the panel. There is also a system for establishing suction in the volume defined between the frames having the panel therebetween.

15 Claims, 6 Drawing Sheets

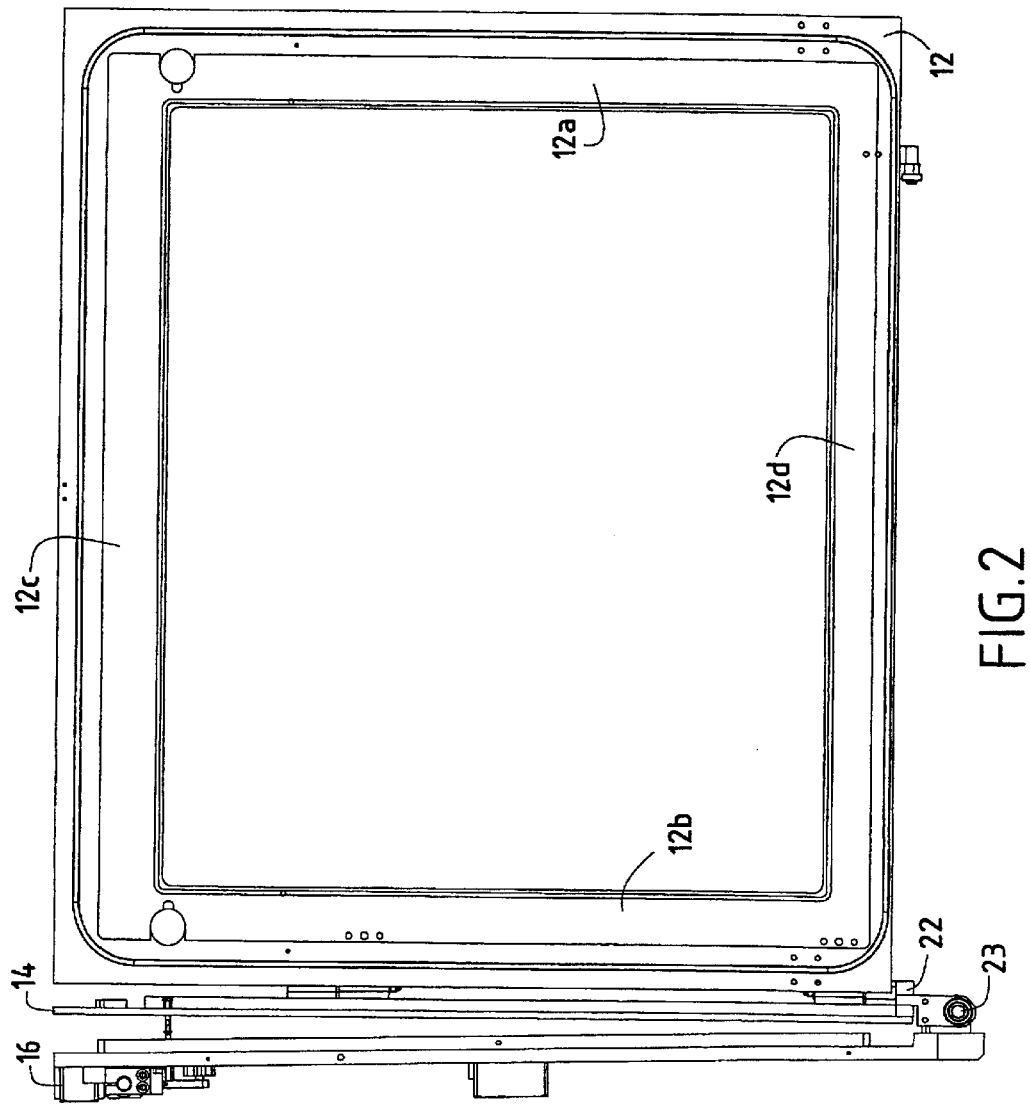

HOLDER FOR HOLDING A PRINTED CIRCUIT FOR EXPOSURE TO LIGHT

The present invention relates to a holder for holding a double-side printed circuit panel for exposure to light.

More precisely, the invention relates to a system enabling two artworks to be held with great accuracy on either side of a panel on which a printed circuit is to be made, and then subjecting the two faces of the resulting assembly to light beams so as to expose both faces of the printed circuit panel through the artworks.

BACKGROUND OF THE INVENTION

When making a double-sided printed circuit panel, i.e. when making conductor tracks on both faces of an insulating support, it is known that the starting assembly comprises an insulating support with respective conductive metal layers made on each of the faces of the insulating support, both of said conductive layers being coated in a photosensitive deposit. Thereafter, the photosensitive layers are subjected to light beams through respective artworks representing the shape of the conductor tracks in positive or negative form, and the photosensitive layer is thus transformed locally, making it possible subsequently to chemically etch away those portions of the photosensitive layer that have been exposed, or on the contrary, those portions of the photosensitive layer that have not been exposed, and then to chemically etch away the conductive layer through the resulting mask so as to leave only the conductor tracks in position.

Such a machine for exposing a panel to light is constituted by a mechanical assembly referred to as an exposure holder and by a light source suitable for delivering two light beams which expose both faces of the printed circuit panel. The present invention relates more particularly to the exposure holder, i.e. to the mechanical machine that makes exposure possible.

The exposure holder serves firstly to position the artworks very accurately on the two faces of the printed circuit panel, and secondly to apply the artworks directly against the face of the panel so as to avoid any diffusion effects during exposure to light.

European patent applications Nos. EP 618 505, EP 807 855, and EP 807 856 filed in the name of the applicant disclose exposure holders, each constituted by a structure carrying a bottom support for the bottom artwork, a top support for the top artwork, and means for positioning the panel between the two artworks. As a general rule, the top support is movable so as to come substantially into contact with the panel placed between the two frames. In addition, by establishing a vacuum between the artworks, close contact is obtained between them and the faces of the panel. The artwork supports are constituted firstly by respective rectangular frames and secondly by respective panes of glass or more generally of a rigid transparent material secured to the frames. The artwork is pressed with one face against the pane and is held thereto by a suction system.

The presence of the pane in the artwork support suffers from certain drawbacks. Firstly, the pane may have defects or scratches or dirt on a face thereof, which can disturb the definition of the surface to be exposed and thus degrade the accuracy with which the conductor tracks are made thereby.

In addition, because of its rigidity, a sheet of glass can present departures from planeness which run the risk of giving rise to defects in the application of the artwork against a wall of the printed circuit panel.

Also, the artwork support pane is relatively rigid, and when a vacuum is established between the top and bottom artwork-supporting panes, that can lead to a pane being broken, and thus to the machine being taken out of operation.

Finally, there is no guarantee that both faces of a pane are accurately parallel to each other. Variations in thickness, although very small, can also lead to the quality of the conductor tracks being degraded.

Nevertheless, it should be recalled that the thickness of the artwork itself is very small, so the artwork is very flexible and can therefore sag significantly if it is not supported by a face that is itself relatively rigid and constituted, in prior machines, by the artwork-supporting pane.

OBJECTS AND SUMMARY OF THE INVENTION

An object of the present invention is to provide a holder for exposing a printed circuit panel to light, the holder making it possible effectively to apply the artworks very accurately to both faces of the printed circuit panel while avoiding the drawbacks associated with the presence of a glass pane or of an analogous transparent support in the artwork-supports of the exposure holder.

To achieve this object, the invention provides a holder for exposing both faces of a panel to light in order to make a double-sided printed circuit or the like by using first and second flexible artworks disposed on either side of said panel, said holder comprising:

a first frame, having no transparent plane support member, for receiving the first flexible artwork;

a second frame, having no transparent plane support member, for receiving the second flexible artwork;

means for positioning and fixing the peripheries of said first and second artworks respectively to said first and second frames;

means for positioning and holding said panel between said first and second frames;

approach means for causing said frames carrying said artworks to move progressively towards the faces of said panel by traveling from a spaced-apart first position towards an exposure second position; and means for establishing suction in the space between the frames fitted with their artworks and containing said panel, thereby causing said artworks to become pressed progressively against the two faces of said panel.

It will be understood that because the artwork is fixed around its entire periphery to the frame, which does not have any panes and more generally any transparent plane supports, it is possible, by moving the two frames towards each other, to press the artworks fixed to the frames progressively against the two faces of the panel. Preferably, the means for establishing suction are activated simultaneously with the means for moving the frames towards each other. This is made easier by synchronizing the movement of the frames, and thus of the artworks, towards each other with establishing suction in the space that extends between the two frames fitted with their artworks, thereby causing the relatively flexible artworks to be applied against the faces of the panel without risking the presence of bubbles of air between an artwork and a face of the panel.

In a preferred embodiment, the holder includes means for defining a pivot axis along the bottom edges of the frames, with said frames carrying their artworks being caused to move towards each other by pivoting about such pivot axis.

Also preferably, the suction means for generating suction are disposed close to the top edges of the frames, and thus to the top edges of the artworks.

BRIEF DESCRIPTION OF THE DRAWINGS

Other characteristics and advantages of the invention will appear more clearly on reading the following description of a preferred embodiment of the invention given by way of non-limiting example. The description refers to the accompanying figures, in which:

FIG. 2 is a side view of the exposure holder, the front frame of the holder being open;

FIGS. 4A and 4B are side views of the holder fitted with a printed circuit panel, shown respectively in a spaced-apart position and in a closed position;

MORE DETAILED DESCRIPTION

Figure 3:
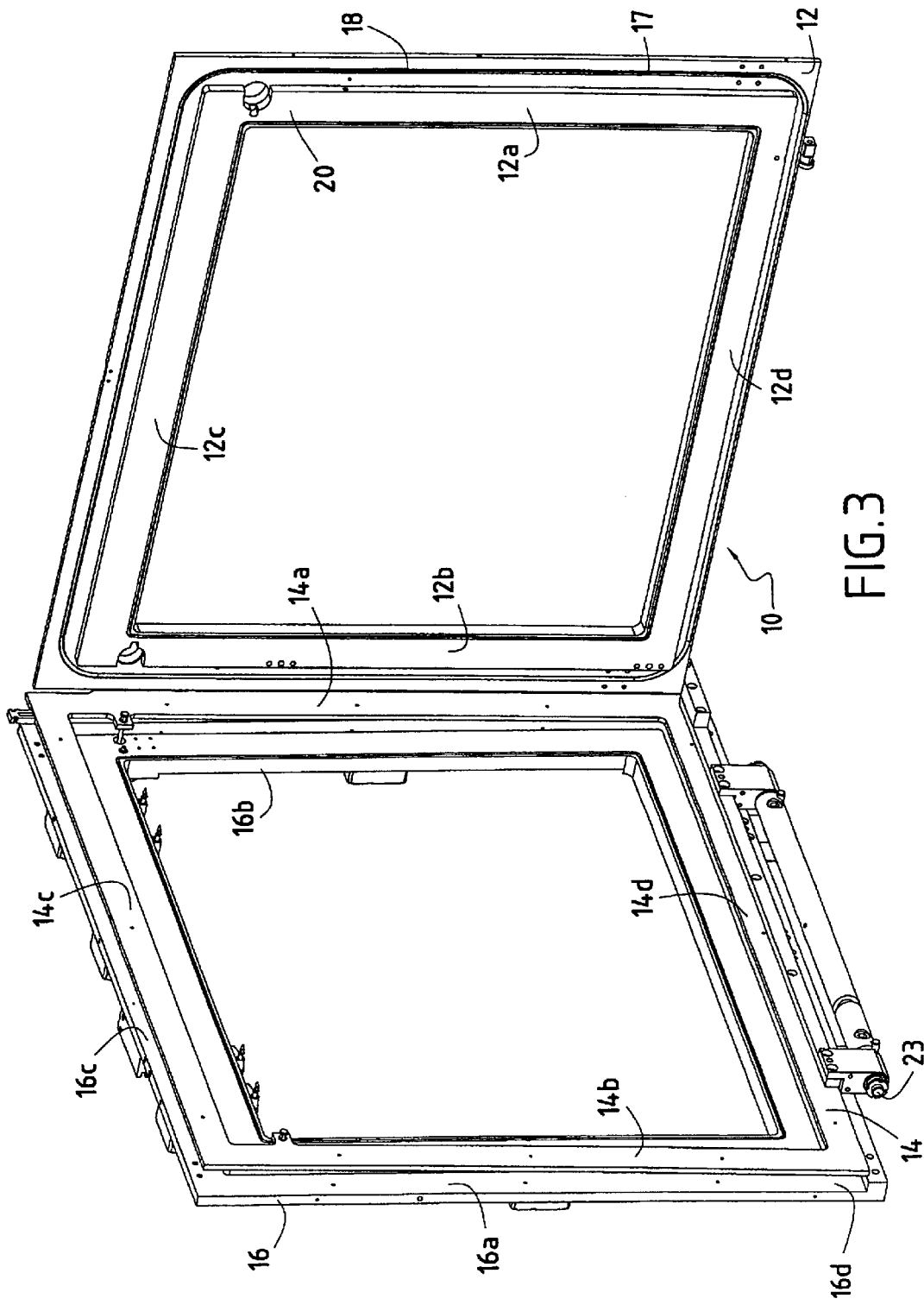
FIG. 3 is a perspective view of the holder as a whole showing the front frame in the open position and the intermediate frame spaced apart from the rear frame.

As shown more clearly in FIG. 3, in the preferred embodiment, the exposure holder 10 comprises a front frame 12 that has no pane of glass, or more generally no transparent plane support, an intermediate frame 14, and a rear frame 16 that likewise has no pane or transparent plane support. The front frame 12 is used for fixing the front artwork, said artwork being fixed on the vertical uprights 12A and 12B and to the horizontal cross-members 12C and 12D of the frame 12. The artworks are initially fixed by means of a suction system including a rectangular groove 18 opening out into the rear face 20 of the frame 12, i.e. its face that faces towards the intermediate frame 14. As explained in greater detail below, this groove 18 is connected to a suction system.

The intermediate frame 14 is also constituted by vertical uprights 14A, 14B and horizontal cross-members 14C and 14D. The rear or front frame 12 is mounted to the intermediate frame via a pivot axis 22 that is substantially vertical and that extends along the vertical upright 12B of the front frame and 14A of the intermediate frame. In its in-use position, the front frame 12 is pressed against the intermediate frame 14 and is secured to the intermediate frame 14 by locking means (not shown). The bottom edge 14D of the intermediate frame 14 is mechanically connected to a bottom pivot axis 23 extending along the horizontal cross-member 14D of the intermediate frame 14. The rear face of the front frame 12 is preferably provided with a peripheral sealing gasket 17 suitable for cooperating with the intermediate frame 14. Finally, the rear frame 16, which is preferably fixed, is preferably vertical and likewise constituted by vertical uprights 16A, 16B and by horizontal cross-members 16C and 16D.

Figure 1:
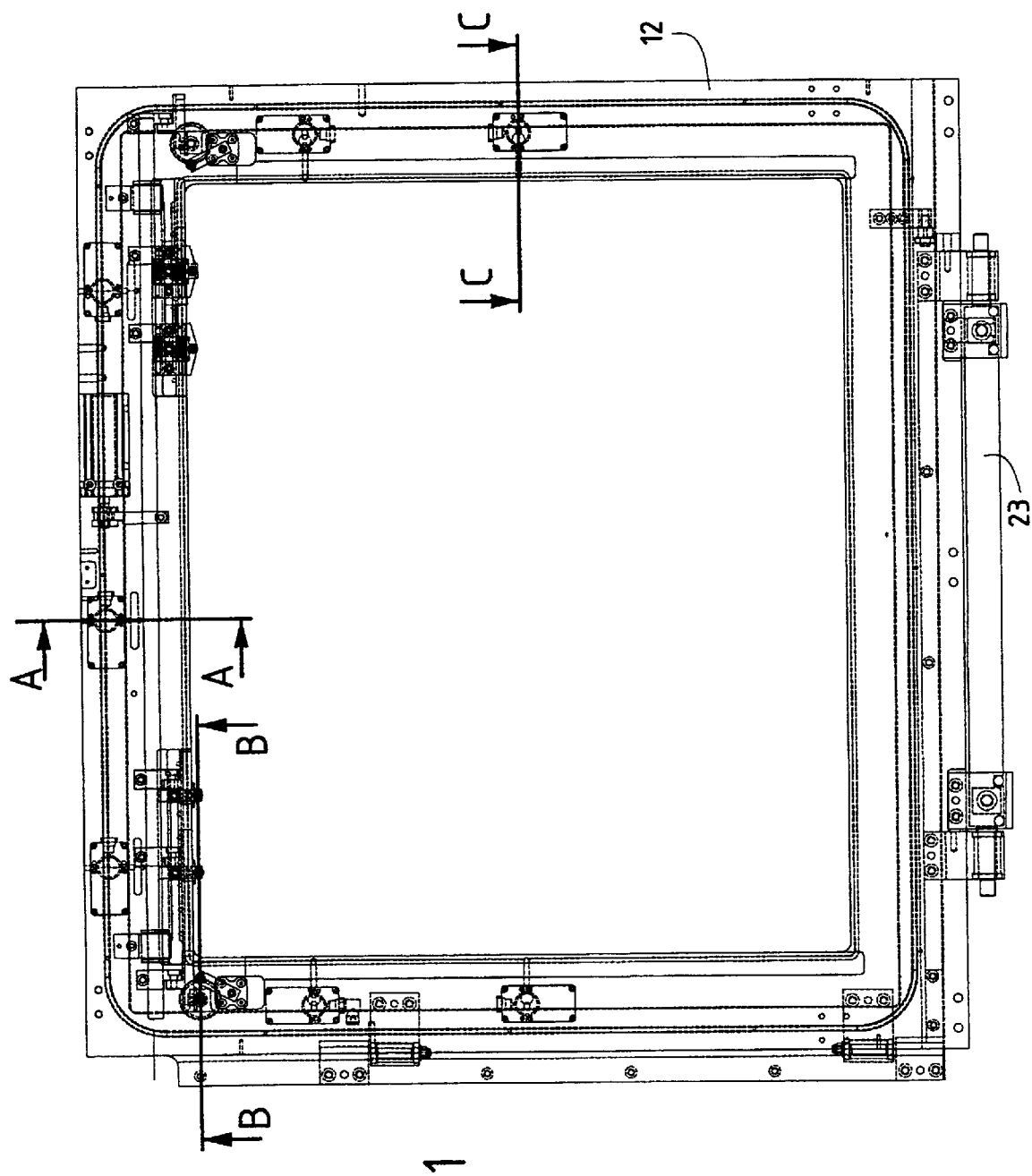
FIG. 1 is a face view of the exposure holder.
Figure 1A:
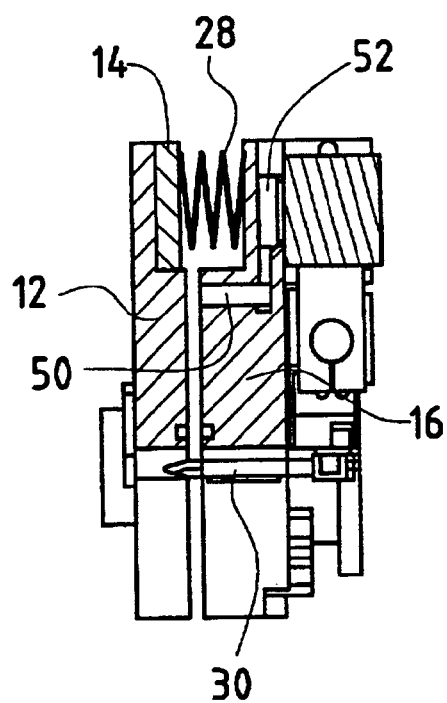
FIG. 1A is a section view on line A—A of FIG. 1.
Figure 1C:
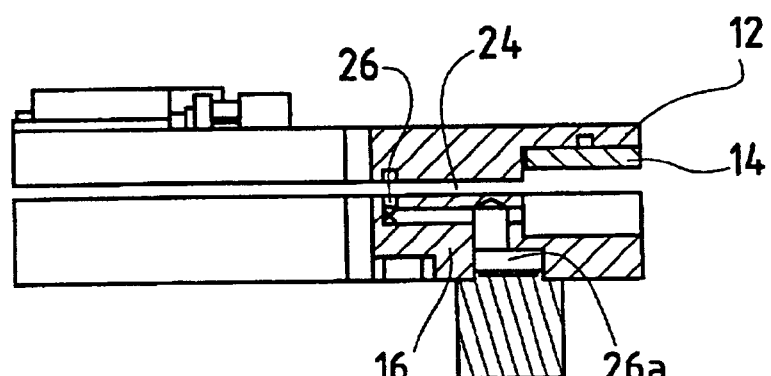
FIG. 1C is a section view on line C—C of FIG. 1.
Figure 1B:
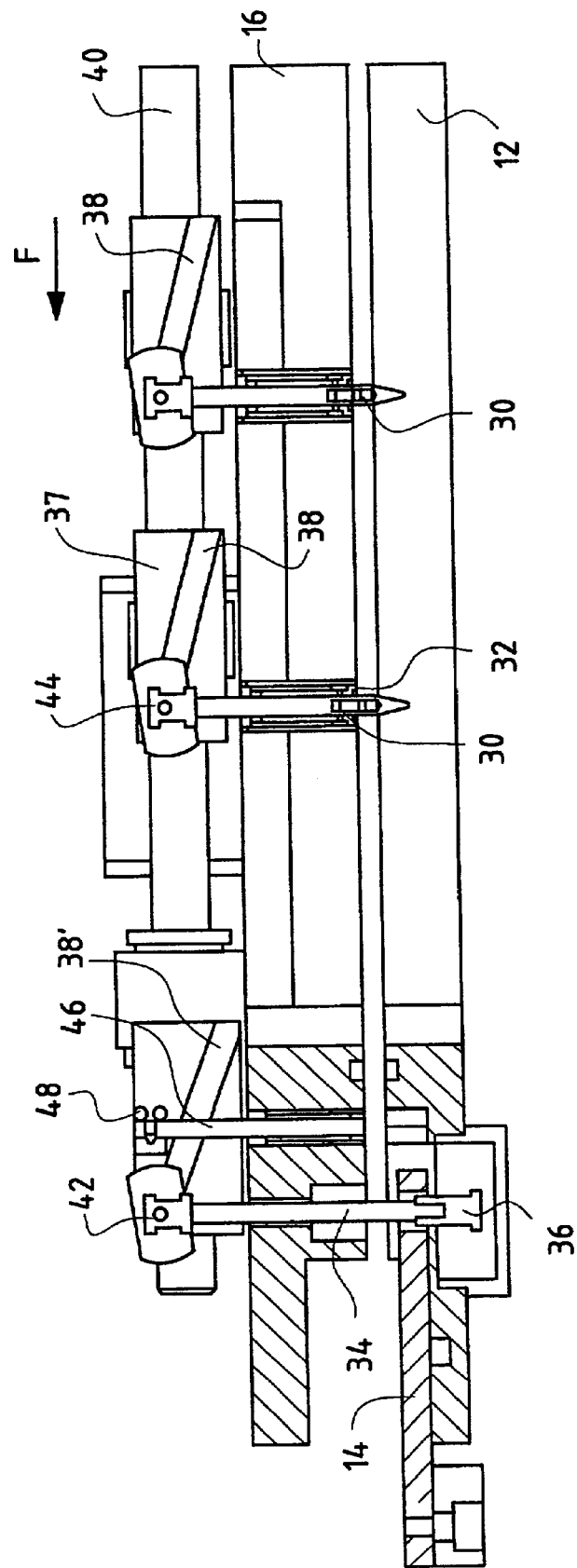
FIG. 1B is a section view on line B—B of FIG. 1.

With reference more particularly to FIG. 1 and to FIGS. 1A to 1C, there follows a more detailed description of the rear frame 16.

To position and fix the rear artwork, the front face 24 of the rear frame 16 also has a groove 26 connected via ducts 26A to a suction source for creating a vacuum. It should also be specified that a sealing bellows 28 is secured around the entire periphery of the rear frame 16. This bellows is also fixed to the periphery of the intermediate frame 14.

With reference more particularly to FIG. 1B, means are described for positioning the artworks and the panel relative to the frames of the holder, as are means for controlling the approach of the front frame 12 and of the panel towards the rear frame 16.

The means for positioning the printed circuit panel are constituted by retractable pegs 30 mounted to move in the top cross-member of the frame 16. These pegs can penetrate into positioning orifices provided in the top edge of the panel. These pegs 30 have respective shoulders 32 enabling the position of the panel to be defined in a direction that is orthogonal to the plane of the rear frame 16, the rear face of the panel bearing against the shoulders 32. The rear frame 16 also carries pegs 34 that enable approach of the intermediate frame 14 and thus of the front frame 12 to be controlled once the two frames have been connected together. The peg 34 has a head 36 which is engaged in the intermediate frame 14. To control synchronized displacement of the pegs 30 that receive the panel and of the pegs 34 that move the intermediate frame, all of the pegs cooperate with cams 37, each presenting a groove 38 or 38', which cams are moved by a common control rod 40 extending parallel to the top edge of the rear frame 16. The pegs 30 or 34 present respective drive studs 42 or 44 that cooperate with the grooves 38. The grooves 38, 38' are directed in such a manner that the distance traveled by the intermediate frame 14 is twice the distance traveled by the panel. It will be understood that by moving the rod 40 in the direction referenced by arrow F, the pegs 30 and 34 are caused to move out from the rear frame, thereby moving the panel and the intermediate frame away from the rear frame 16.

The front and rear artworks are initially positioned by means of moving pegs such as 46, which are likewise mounted in the rear frame 16 and more precisely in its vertical uprights. These pegs 46 are also retractable, and they are moved under the control of a fork 48, itself preferably driven by a special actuator that is not shown in the figures. The pegs are retracted once the artworks have been fixed on the frames.

As shown more clearly in FIG. 1A, the top cross-member of the rear frame 16 is also fitted with suction passages 50 opening out into the front face of the top cross-member of said frame and connected by pipes such as 52 to vacuum pumps that are preferably constituted by Venturi systems. These suction passages 50 open out well above the pegs 30 supporting the panel, and thus above the top edge of the panel after it has been put into place on the pegs 30.

Now that the main component elements of the exposure holder have been described, its method of use is described below.

Use of the above-described exposure holder 10 includes a preliminary stage of positioning and fixing the artworks respectively to the front frame 12 and to the rear frame 16, and after said initial fixing, a stage of normal use which consists of putting into place successive printed circuit panels for exposure of their two main faces through the artworks previously fixed to the front and rear frames.

For the initial stage of positioning and fixing the artworks, it is the retractable pegs 46 of the rear frame and the panel positioning pegs 30 that are used.

With the front frame 12 in its open position as shown in FIG. 3, the rear artwork is put into place on the pegs 46 using calibrated orifices provided in the top edge of the artwork, and then putting into place on the pegs 30 a panel having the same thickness as the panels that are subsequently exposed, or even a spacer corresponding to said thickness, and the horizontal hinge-forming means 23 are adjusted likewise using spacers so as to match the holder to the thickness of the panels. Finally, the front artwork is put into place on the pegs 46. In this position, the artworks are merely suspended via their respective top edges on the studs pegs 46. Thereafter, the front frame 12 is pivoted about the vertical axis 22, and the front frame is locked to the intermediate frame 14 in such a manner that these two frames act as a single element. Suction is applied to the positioning grooves 18 and 26 respectively in the front frame and in the rear frame. This causes the peripheries of the artworks to be secured and positioned on the front and rear frames, and thus ensures that the two artworks are accurately in alignment with each other. Alignment is accurate to within about 25 microns at any point on the artworks. After this operation, the front frame 12 is again opened in order to fix the artworks with additional means such as an adhesive material applied respectively to the front frame and to the rear frame, while maintaining suction in the grooves. The panel or the spacer that was used for initial positioning of the artworks is removed. The exposure holder is then ready for use in exposing the two faces of a printed circuit panel through the artworks that have already been put into place.

For normal utilization of the holder, the front frame 12 having the front artwork fixed thereto is in the open position and a panel for exposure is put into place on the supporting pegs 30 which are in the extended position, after which the front frame 12 is closed onto the intermediate frame 14 and they are locked together.

With reference to FIGS. 5A to 5D and 6, there follows a description of how the front and rear artworks are applied to the faces of the printed circuit panel progressively as the assembly constituted by the front frame 12 and the intermediate frame 14 moves towards the rear frame 16.

These figures are simplified. Only the front frame 12 is shown. The intermediate frame is not shown. In fact, during these steps, the front frame 12 and the intermediate frame 14 form a unique assembly.

Before this detailed description, it can be mentioned that, in accordance with the invention, controlled advance of the artworks from either side of the panel is implemented synchronously with suction via orifices 50 formed through the top cross-member of the rear frame and connected to the vacuum pumps. It will be understood that the volume defined by the front frame on which the front artwork is fixed and by the rear frame 16 on which the rear artwork is fixed is made leak-tight, firstly by sealing lips placed between the front panel and the intermediate panel, and secondly by the peripheral sealing bellows mounted between the intermediate frame and the rear frame.

Figures 5A, 5B, 5C, 5D:
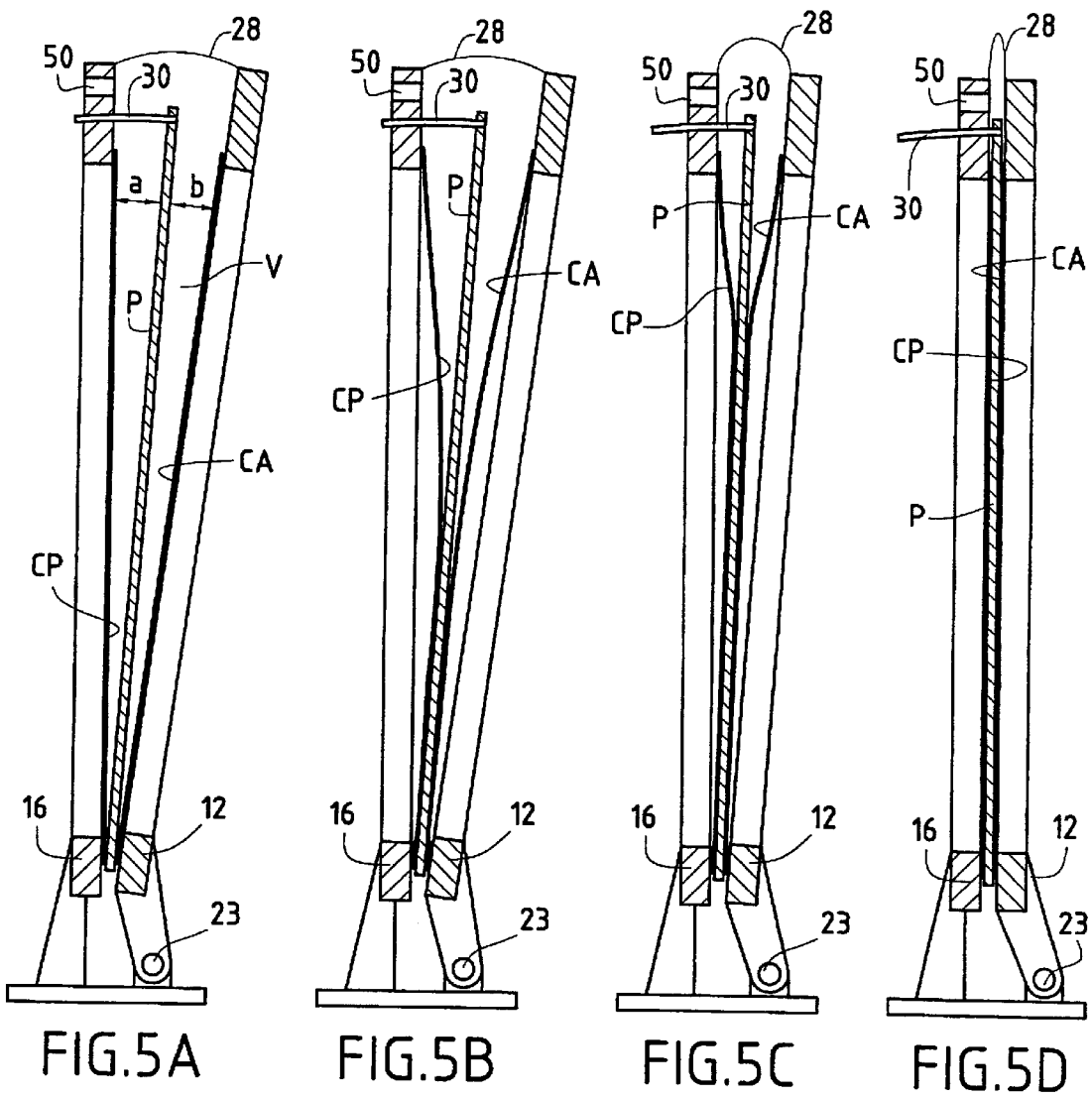
FIGS. 5A to 5D are simplified theoretical views showing how the two artworks come progressively to press against the two faces of the printed circuit panel.
Figure 6:
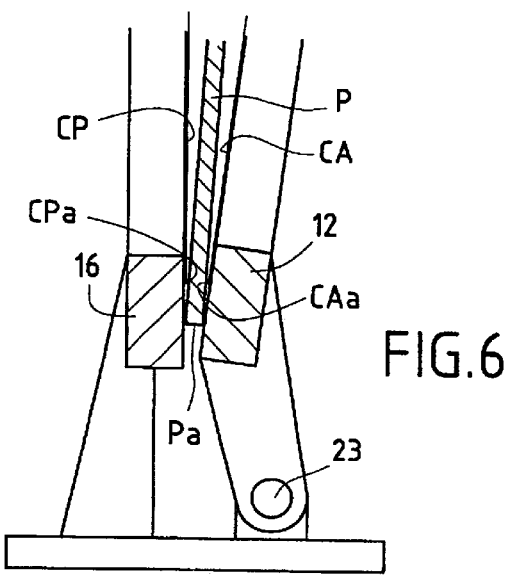
FIG. 6 is a view showing details of FIG. 5A.

FIG. 5A shows the initial position of the holder. The panel P is suspended from the pegs 30 and the front and rear artworks CA and CP are fixed respectively to the front and rear frames 12 and 16. The front frame 12 is locked on the intermediate frame 14. The bellows 28 seals the volume V defined by the front and rear frames. The shoulders on the pegs 30 hold the top portion of the panel P in such a manner that the angles a and b are substantially equal. The angles a and b are highly exaggerated so as to make FIG. 5A more readable. In reality, these angles are about 5° to 7°. FIG. 6 shows that the bottom edge Pa is in contact with the bottom edges CAa and CPa respectively of the front and rear artworks, the edges of the artworks being fixed to the frames. This situation is made possible by using removable adjustment wedges in register with the hinge 23 and adapted to the thickness of the panel. Naturally, it is also necessary to provide removable wedges likewise adapted to the thickness of the panel in register with the heads of the pegs 34 for moving the intermediate frame 14 closer so as to ensure that the stroke of the approach means is constant and that the frames are parallel to one another in the final position.

In the following step as shown in FIG. 5B, suction has begun to be established inside the volume V through the orifices 50 of the rear frame 16. Under the effect of the suction, the artworks, which are flexible and are fixed only via their peripheries, take on curvature which is greatly exaggerated in the figure so as to make the figure more legible. In contrast, the panel P remains plane, since the same suction exists on both sides of the panel. When the panel P and the front artwork CA begin to approach the rear artwork, the bottom portions of the artworks become regularly and progressively pressed against the bottom portions of both sides of the panel, with the approach substantially keeping the angles a and b equal to each other. Since the suction in the volume V is established in the top portion of the volume V, the artworks become pressed progressively against the two faces of the panel, beginning with their bottom portions, and no bubbles of air are trapped.

FIG. 5C shows an intermediate position in which the artworks have already been pressed for the most part against the faces of the panel P.

FIG. 5D shows the final position in which the artworks CA and CP are fully pressed against the faces of the panel P. It is then possible to expose the panel P through the artworks CA and CP. During exposure, the suction between the artworks and the panel is maintained.

The manner in which the artworks are pressed progressively against both faces of the panel in a vertical direction is described above with reference to FIGS. 5A to 5D. It will be understood that in the horizontal direction, the artworks also present curvature. As the front frame 12 and the panel P move towards the rear frame 16, the artworks initially make contact with the faces of the panel in their central portions, and contact then spreads progressively across the entire width of the artworks. This prevents air bubbles becoming trapped between the panel and the artworks.

In the above description, it has been assumed that the front frame and the panel are moved towards the rear frame by pivoting about an axis extending along the bottom edge of the front frame. Naturally, the approach movement could be implemented differently.

The front frame and the panel could be moved towards the rear frame by moving in translation orthogonally to the plane of the rear plane. It is also possible to move the two frames towards each other while leaving the panel stationary. It is necessary for the holder to have means for keeping the panel vertical through the sealing means placed at the periphery of the front and rear frames.

Under such circumstances, the bottom pivot axis 23 is omitted. Approach pegs analogous to the pegs 34 are provided in the bottom cross-member of the rear frame 16, these pegs cooperating with the bottom cross-member of the intermediate frame. The bottom approach pegs can be controlled for displacement purposes by cams that are identical or analogous to the cams 37 of the top cross-member. The rod 40 carrying the top cams can be a drive rod, with the rod controlling the bottom cams being connected to the top rod 40 by a transmission belt. If the transmission ratio is equal to unity, then the front and rear frames 12 and 16 remain parallel throughout their displacement.

If the bottom cams are controlled by independent means, e.g. an actuator, then the approach between the two frames will comprise both relative movement in translation and relative movement in pivoting.

Under the effect of the suction created between the two frames, the two artworks take on curvature identical to that described above. As the artworks come closer to the panel, during which time the panel is kept at equal distances from both frames, it is the central zones of the artworks that make first contact with the faces of the panel. Thereafter, this contact spreads towards the horizontal and vertical edges of the panel, both progressively and simultaneously. This process ensures that no air bubbles are trapped between the panel and the artworks.

The first frame is preferably vertical and the second frame, when in its first position, preferably presents a small angle relative to the first frame.

What is claimed is:

1. A holder for exposing both faces of a panel to light in order to make a double-sided printed circuit by using first and second flexible artworks disposed on either side of said panel, said holder comprising:
   a first frame, having no transparent plane support member, for receiving the first flexible artwork;
   a second frame, having no transparent plane support member, for receiving the second flexible artwork;
   means for positioning and fixing the peripheries of said first and second artworks respectively to said first and second frames;
   means for positioning and holding said panel between said first and second frames;
   approach means for causing said frames carrying said artworks to move progressively towards the faces of said panel by traveling from a spaced-apart first position towards an exposure second position; and
   means for establishing suction in the space between the first and second frames having the peripheries of said first and second artworks respectively fixed thereto and said panel therebetween, thereby causing said artworks to become pressed progressively against the two faces of said panel.

2. An exposure holder according to claim 1, wherein said means for establishing suction and the approach means are activated simultaneously.

3. An exposure holder according to claim 2, wherein said first frame is vertical and said second frame, in its first position, is at a small angle relative to the first frame.

4. An exposure holder according to claim 3, wherein each of said frames has a bottom edge, and wherein said holder further comprises means for establishing a pivot axis along said bottom edges, said frames being moved towards each other by pivoting about said axis.

5. An exposure holder according to claim 3, wherein the means for positioning and holding said panel comprise means for supporting panel via its top edge.

6. An exposure holder according to claim 5, wherein the means for supporting said panel comprise pegs projecting into the inside face of the top edge of the first frame and holes formed in said panel close to its top edge and suitable for cooperating with said pegs.

7. An exposure holder according to claim 3, further including means for establishing sealing between the peripheries of said frames, and wherein said means for creating suction comprise suction means for sucking out the gas contained in the volume defined by said frames carrying their artworks and said sealing means.

8. An exposure holder according to claim 7, wherein said suction means are disposed close to the top edges of said frames.

9. An exposure holder according to claim 1, further comprising synchronization means for synchronizing the means for creating suction and the means for moving said frames towards each other whereby both artworks are pressed progressively against both faces of said panel, starting from the bottom edges of said artworks and going up to their top edges.

10. An exposure holder according to claim 3, wherein said means for positioning the artworks relative to said frames comprise positioning pegs projecting from the inside face of the top edge of the first frame and holes formed in said artworks close to their top edges and suitable for cooperating with said positioning pegs.

11. An exposure holder according to claim 1, wherein the approach means comprise means for moving the panel towards said first frame and means for moving the second frame towards the first frame in such a manner that the distance between the first frame and the panel remains substantially equal to the distance between the panel and the second frame.

12. An exposure holder according to claim 1, wherein the means for fixing the peripheries of said first and second artworks respectively to said first and second frames comprise a peripheral groove formed in a face of each of said first and second frames for receiving respectively said first and second artworks, and means for connecting said groove to suction means.

13. An exposure holder for applying two flexible artworks against two respective faces of a panel in order to make a printed circuit, said holder comprising:

- a first and a second support, each in the form of a frame;
- means for positioning and fixing said artworks to said supports;
- means for holding said panel between said supports;
- means for defining a pivot axis parallel to an edge of said first support and of said panel;
- means for moving said artworks towards the faces of said panel by relative pivoting about said pivot axis so that the two angles between said panel and said supports remain substantially equal; and
- means for creating suction in the volume defined by said supports and containing said panel, the suction being created from a zone of said volume that is remote from said pivot axis, and said suction being created simultaneously with said artworks being moved towards the panel, whereby said artworks are deformed and applied regularly and progressively against the faces of said panel starting from its edge close to said pivot axis and going to its opposite edge.

14. A holder according to claim 13, wherein said means for creating suction comprise deformable sealing means mounted on the periphery of said first and second supports, and means for connecting said volume to suction means.

15. A holder for exposing both faces of a panel to light in order to make a double-sided printed circuit by using first and second flexible ariworks disposed on either side of said panel, said holder comprising:

- a first frame, having no transparent plane support member, for receiving the first flexible artwork;
- a second frame, having no transparent plane support member, for receiving the second flexible artwork;
- means for positioning and fixing the peripheries of said first and second artworks respectively to said first and second frames;
- means for positioning and holding said panel between said first and second frames;
- means for establishing a pivot axis along a bottom edge of each of said frames, said frames being moved towards each other by pivoting about said axis;
- approach means for causing said frames carrying said artworks to move progressively towards the faces of said panel by traveling from a spaced-apart first position towards an exposure second position; and
- means for establishing suction in the space between the first and second frames having the peripheries of said first and second artworks respectively fixed thereto and said panel therebetween, thereby causing said artworks to become pressed progressively against the two faces of said panel.

* * * * *